(12) United States Patent
Kim et al.

(10) Patent No.: US 9,318,423 B2
(45) Date of Patent: Apr. 19, 2016

(54) LEADLESS PACKAGE TYPE POWER SEMICONDUCTOR MODULE

(71) Applicant: SAMSUNG ELECTRO-MECHANICS CO., LTD., Suwon-Si (KR)

(72) Inventors: Kwang Soo Kim, Suwon-Si (KR); Kee Ju Um, Suwon-Si (KR); Suk Ho Lee, Suwon-Si (KR); Joon Seok Chae, Suwon-Si (KR)

(73) Assignee: Samsung Electro-Mechanics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/572,763

(22) Filed: Dec. 16, 2014

(65) Prior Publication Data

US 2015/0214140 A1    Jul. 30, 2015

(30) Foreign Application Priority Data

Jan. 29, 2014 (KR) ........................ 10-2014-0011490

(51) Int. Cl.
*H01L 23/495* (2006.01)
*H01L 23/02* (2006.01)
*H01L 23/48* (2006.01)
(Continued)

(52) U.S. Cl.
CPC .... *H01L 23/49548* (2013.01); *H01L 23/49537* (2013.01); *H01L 23/49551* (2013.01); *H01L 23/49562* (2013.01); *H01L 23/49575* (2013.01); *H01L 24/49* (2013.01); *H01L 25/18* (2013.01); *H01L 23/3107* (2013.01); *H01L 23/49531* (2013.01); *H01L 2224/48091* (2013.01); *H01L 2224/48106* (2013.01); *H01L 2224/48108* (2013.01); *H01L 2224/48137* (2013.01);

(Continued)

(58) Field of Classification Search
CPC .................. H01L 23/49548; H01L 23/49575; H01L 24/49; H01L 23/3107; H01L 25/18; H01L 2224/48177; H01L 2224/48145; H01L 2224/48091; H01L 2224/48106; H01L 2224/48108; H01L 2924/14
USPC .......................... 257/676, 686, 777, 784, 786
See application file for complete search history.

(56) References Cited

U.S. PATENT DOCUMENTS

2010/0091472 A1* 4/2010 Kummerl et al. ............. 361/772
2011/0058342 A1* 3/2011 Kawakita et al. ............. 361/735

FOREIGN PATENT DOCUMENTS

KR    10-2002-0095053 A    12/2002
KR    10-2006-0017711 A    2/2006

*Primary Examiner* — A. Sefer
*Assistant Examiner* — Dilinh Nguyen
(74) *Attorney, Agent, or Firm* — Ladas & Parry, LLP

(57) ABSTRACT

There is provided a leadless package type power semiconductor module. According to an exemplary embodiment of the present disclosure, the leadless package type power semiconductor module includes: connection terminals of a surface mounting type (SMT) formed at edges at which respective sides of four surfaces meet each other; a first mounting area connected to the connection terminals through a bridge to be disposed at a central portion thereof and mounted with power devices or control ICs electrically connected to the power devices to control the power devices; and second mounting areas formed between the connection terminals and mounted with the power devices or the control ICs, wherein the first mounting area is disposed at a different height from the second mounting area through the bridge to generate a phase difference from the second mounting area. Therefore, it is possible to implement a high-integration, high-performance, and small power semiconductor module by applying a three-dimensional structure deviating from a one-dimensional flat structure.

10 Claims, 6 Drawing Sheets

(51) Int. Cl.
*H01L 23/52* (2006.01)
*H01L 29/40* (2006.01)
*H01L 23/00* (2006.01)
*H01L 25/18* (2006.01)
*H01L 23/31* (2006.01)

(52) U.S. Cl.
CPC .................. *H01L2224/48145* (2013.01); *H01L 2224/48177* (2013.01); *H01L 2224/49171* (2013.01); *H01L 2924/00014* (2013.01); *H01L 2924/13055* (2013.01); *H01L 2924/13091* (2013.01); *H01L 2924/14* (2013.01)

LEADLESS PACKAGE TYPE POWER SEMICONDUCTOR MODULE

CROSS-REFERENCE TO RELATED APPLICATION

This application claims the benefit of Korean Patent Application No. 10-2014-0011490, filed on Jan. 29, 2014, entitled "Leadless Package Type Power Semiconductor Module" which is hereby incorporated by reference in its entirety into this application.

BACKGROUND

The present disclosure relates to a leadless package type power semiconductor module.

According to a general power semiconductor module as published in Patent Document 1, a power device and a control IC are mounted on a lead frame and an external terminal is formed using the lead frame. Further, Patent Document 2 publishes a structure in which a power device and a control IC are mounted on a heat radiating substrate and a lead frame is connected to an outside of the heat radiating substrate to form an external terminal.

However, the general power semiconductor module has a one-dimensional structure using a lead frame terminal for connecting to the outside and using an inner lead frame or the heat radiating substrate on which various devices are mounted and therefore it is difficult to reduce a size of the power semiconductor module.

That is, a market has demanded a high-integration, high-performance, and small power semiconductor module, but the above-mentioned general power semiconductor module has a dual in-line package (DIP) form or a single in-line package (SIP) form. The semiconductor module having the structure is hardly to be highly integrated and miniaturized due to a flat structure of the inner lead frame mounted with lead frame terminals and various devices which are connected to the outside in terms of characteristics of the structure of the power semiconductor module.

RELATED ART DOCUMENT

Patent Document (Patent Document 1) KR2002-0095053 A
(Patent Document 2) KR2006-0017711 A

SUMMARY

An aspect of the present disclosure may solve market needs for a leadless package type power semiconductor module by deviating from a one-dimensional structure, that is, a flat structure of the power semiconductor module.

Another aspect of the present disclosure may provide a leadless package type power semiconductor module capable of easily achieving high integration, high performance, and miniaturization by improving a mounting structure of a device.

According to an aspect of the present disclosure, a leadless package type power semiconductor module may include: connection terminals of a surface mounting type (SMT) formed at edges at which respective sides of four surfaces meet each other; a first mounting area connected to the connection terminals through a bridge to be disposed at a central portion thereof and mounted with power devices or control ICs electrically connected to the power devices to control the power devices; and second mounting areas formed between the connection terminals and mounted with the power devices or the control ICs, wherein the first mounting area is disposed at a different height from the second mounting area through the bridge to generate a phase difference from the second mounting area.

The control ICs may be mounted in the first mounting area and the power devices may be mounted in the second mounting area.

The power devices may be mounted in the first mounting area and the control ICs may be mounted in the second mounting area.

The power devices and the control ICs may be connected to each other by wire bonding.

The second mounting areas may be disposed at both sides, having the first mounting area therebetween, the power devices may be mounted in the second mounting areas, and the respective power devices may be connected to each other by wire bonding.

According to another aspect of the present disclosure, a leadless package type power semiconductor module may include: power devices and control ICs electrically connected to the power devices to control the power devices; a bridge lead frame having a central portion provided with a first mounting area in which the power devices or the control ICs are mounted, having respective edges provided with connection terminals of a surface mounting type (SMT), provided with a bridge connecting the connection terminals to the first mounting area, and provided with a space part to generate a phase difference between the connection terminal and the first mounting area; and an inner lead frame of the surface mounting type (SMT) disposed in the space part and provided with a second mounting area in which the power devices or the control ICs are mounted.

The control ICs may be mounted in the first mounting area and the power devices may be mounted in the second mounting area.

The power devices may be mounted in the first mounting area and the control ICs may be mounted in the second mounting area.

The power devices and the control ICs may be connected to each other by wire bonding.

The inner lead frames may be disposed at both sides, having the first mounting area therebetween, the power devices may be mounted in the second mounting areas, and the respective power devices may be connected to each other by wire bonding.

The leadless package type power semiconductor module may further include: a printed circuit board (PCB) on which passive devices are mounted, wherein the printed circuit board is mounted with the connection terminals and one surface of the inner lead frame by the surface mounting type and the control ICs are connected to the passive devices by wire bonding.

The leadless package type power semiconductor module may further include: an EMC mold sealing the bridge lead frame, the inner lead frame, the power devices, and the control ICs.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
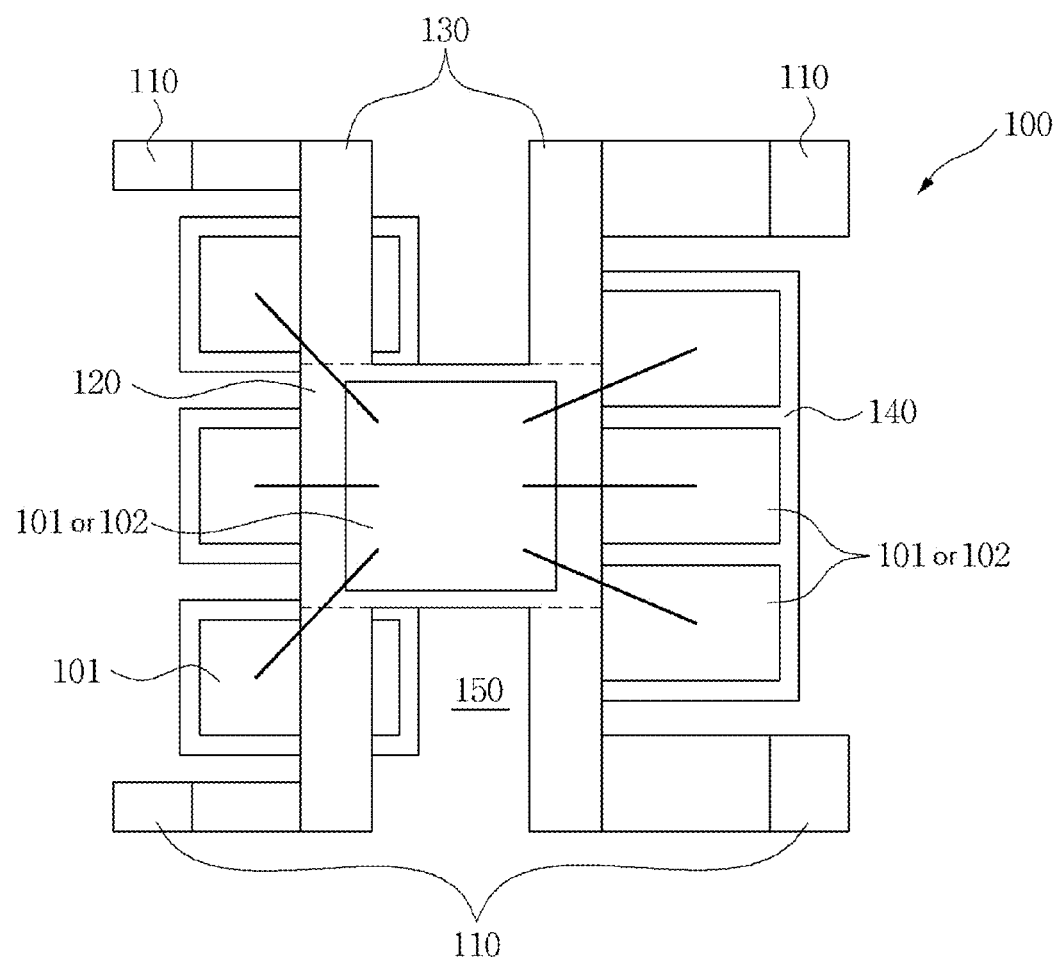
FIG. 1 is a plan view illustrating a power module package according to a first exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

A leadless package type power semiconductor module according to an exemplary embodiment of the present disclosure is a leadless package type in which a lead frame for connecting to the outside is removed and adopts a surface mount type (SMT) of a quad flat package (QFP) which performs mounting using all the surfaces of the leadless package type power semiconductor module and is applied with a three-dimensional structure deviating from a one-dimensional flat structure so as to implement high integration/high performance/miniaturization.

That is, unlike the power semiconductor module having a dual in-line package (DIP) structure or a single in-line package (SIP) structure, connection terminals are formed using all the edges at which respective sides of four surfaces meet each other to be able to remove all the lead frames connected to the outside. Further, power devices or control ICs are mounted in a mounting area connected to the connection terminals and another mounting area disposed to be spaced apart from the connection terminals, respectively and are electrically connected to each other.

Here, the plurality of mounting areas are formed at different heights to generate a phase difference and thus as described above, a three-dimensional structure deviating from a one-dimensional flat structure is formed.

Therefore, the leadless package type power semiconductor module according to the exemplary embodiment of the present disclosure has a reduced size as much as 50% or more, as compared with the power semiconductor module according to the related art (DIP/SIP). The leadless package type power semiconductor module may be automatically mounted on a printed circuit board (PCB) and be bonded thereto by soldering and therefore may solve a limitation in production management and a process having a high defective rate due to a manual insertion process or a semi-manual insertion process of directly mounting parts by a worker's hand to mount the leadless package type power semiconductor module on the printed circuit board at the time of manufacturing an inverter which is a problem of the related art and may remarkably prevent a loss or a malfunction due to parasitic impedance by minimizing a current path between the power devices or between the power devices and the control ICs.

Hereinafter, exemplary embodiments of the present disclosure will be described in detail with reference to the accompanying drawings.

First Exemplary Embodiment

Figure 2:
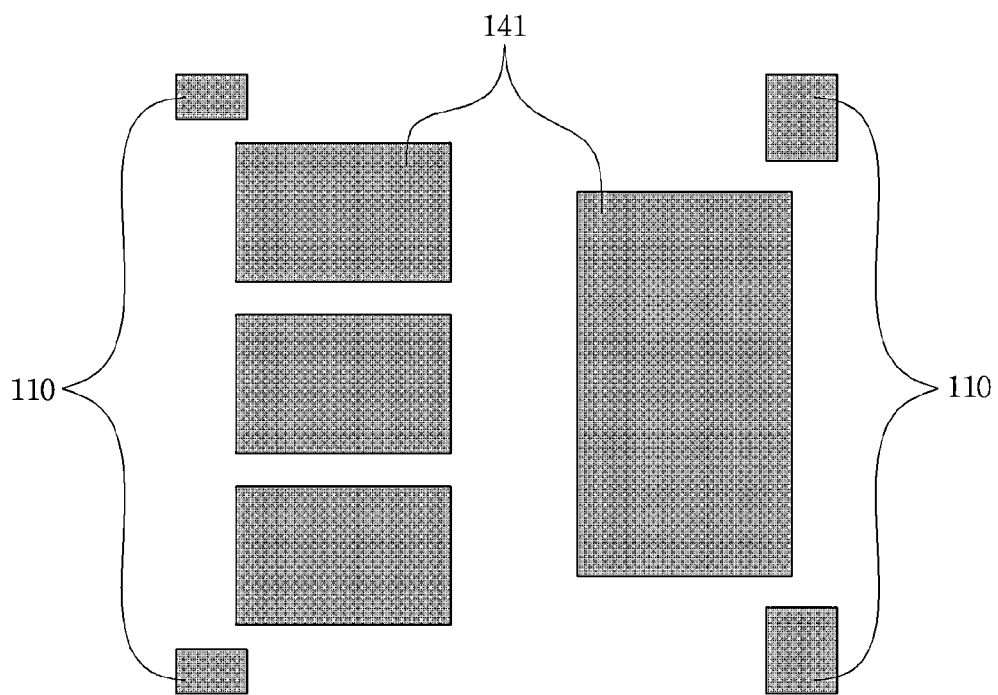
FIG. 2 is a bottom view illustrating the power module package according to the first exemplary embodiment of the present disclosure.
Figure 3:
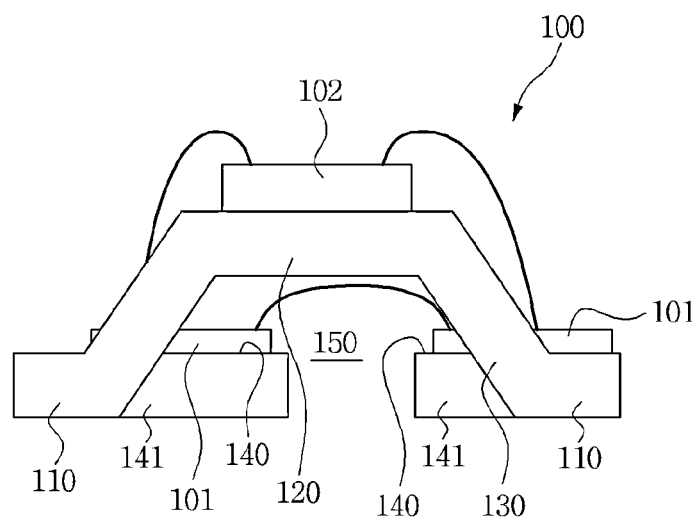
FIG. 3 is a side view illustrating the power module package according to the first exemplary embodiment of the present disclosure.

As illustrated in FIGS. 1 to 3, a leadless package type power semiconductor module 100 according to a first exemplary embodiment of the present disclosure includes four connection terminals 110 formed at edges at which respective sides of four surfaces meet each other, a first mounting area 120 connected to each connection terminal 110 through a bridge and disposed at a central portion of the leadless package type power semiconductor module 100 to be mounted with power devices 101 or control ICs 102 controlling the power devices 101, and second mounting areas 140 formed between the respective connection terminals 110 to be mounted with the power devices 101 or the control ICs 102.

One surface of each connection terminal 110 is mounted by the surface mounting type (SMT) and the other surface thereof is physically connected to the first mounting area 120 through the bridge 130, and thus all the four surfaces of the leadless package type power semiconductor module 100 may be used, thereby removing a lead frame connected to the outside.

The first mounting area 120 is disposed at the central portion of the leadless package type power semiconductor module 100 to be mounted with the power devices 101 including MOSFET, RC-IGBT, IGBT, FRD, and the like or the control ICs 102 including HVIC, LVIC, and the like. Therefore, the leadless package type power semiconductor module 100 has a "H" shape when viewed from the top.

Here, a space part 150 is formed at a lower portion of the bridge 130 by bending the bridge 130 of the first mounting area 120 upwardly in FIGS. 1 to 3 to generate a phase difference between the connection terminal 110 and the first mounting area 120 and between the first mounting area 120 and the second mounting areas 140, thereby three-dimensionally mounting the power devices 101 and the control ICs 102.

That is, when the first mounting area 120 and the second mounting area 140 are defined to have different heights by bending the bridge 130 upwardly using an oblique line and a straight line, for example, the second mounting area 140 is defined as a first layer of the leadless package type power semiconductor module 100, the first mounting area 120 is disposed on a second layer to generate a phase difference.

Meanwhile, for example, the second mounting area 140 is formed on one surface of an inner terminal 141 practiced as the lead frame, and the like which may be applied with the surface mounting type (SMT) and thus is disposed in the space part 150 formed by bending the bridge 130 but is disposed at both sides, having the first mounting area 120 therebetween. In this case, when the power devices 101 are mounted in the second mounting areas 140, they are connected to each other by wire bonding using the space part 150 to minimize a current path.

The power devices 101 may be mounted in any one of the first and second mounting areas 120 and 140 and the control ICs 102 may also be mounted in any one of the first and second mounting areas 120 and 140, and thus the power devices 101 and the control ICs are electrically connected to each other by the wire bonding using the space part 150.

Therefore, according to the leadless package type power semiconductor module 100 according to the first exemplary embodiment of the present disclosure, all the four surfaces may be used due to the surface mounting type (SMT) structure of the quad flat package (QFP) and the power devices 101 and the control ICs 102 may be three-dimensionally mounted, thereby implementing high integration and miniaturization.

Further, at the time of mounting the power semiconductor module on the printed circuit board (PCB), the automatic mounting and the soldering may be performed, and thus the existing problem that the defective rate is increased due to a manual insertion process or a semi-manual insertion process of inserting the power semiconductor module into a hole formed in a circuit pattern of the printed circuit board (PCB) and the production management is degraded due to the additional use of a wave soldering process after other passive devices are inserted into the printed circuit board (PCB) unlike the soldering is solved, thereby simplifying the package process and increasing the efficiency.

Further, the loss or the malfunction due to the parasitic impedance is remarkably reduced by minimizing the current path between the power devices 101 or between the power devices 101 and the control ICs 102, thereby improving the performance.

Second Exemplary Embodiment

Figure 4:
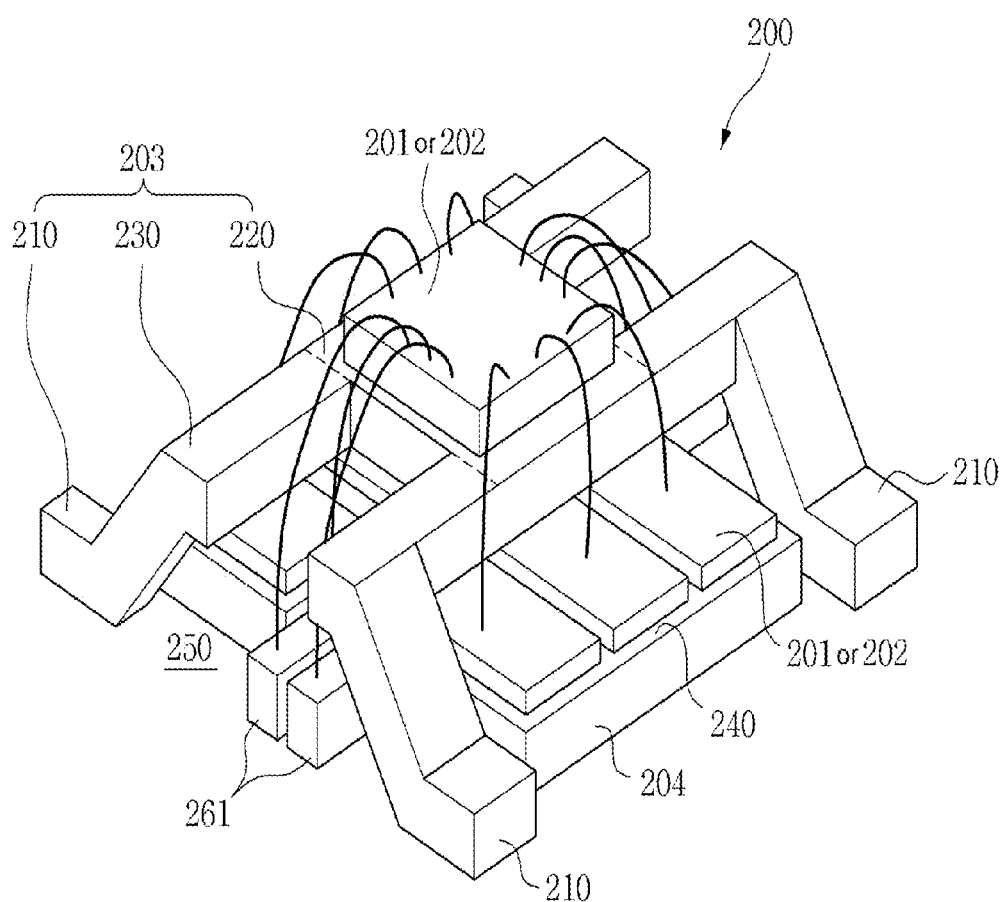
FIG. 4 is a perspective view illustrating a power module package according to a second exemplary embodiment of the present disclosure.
Figure 5:
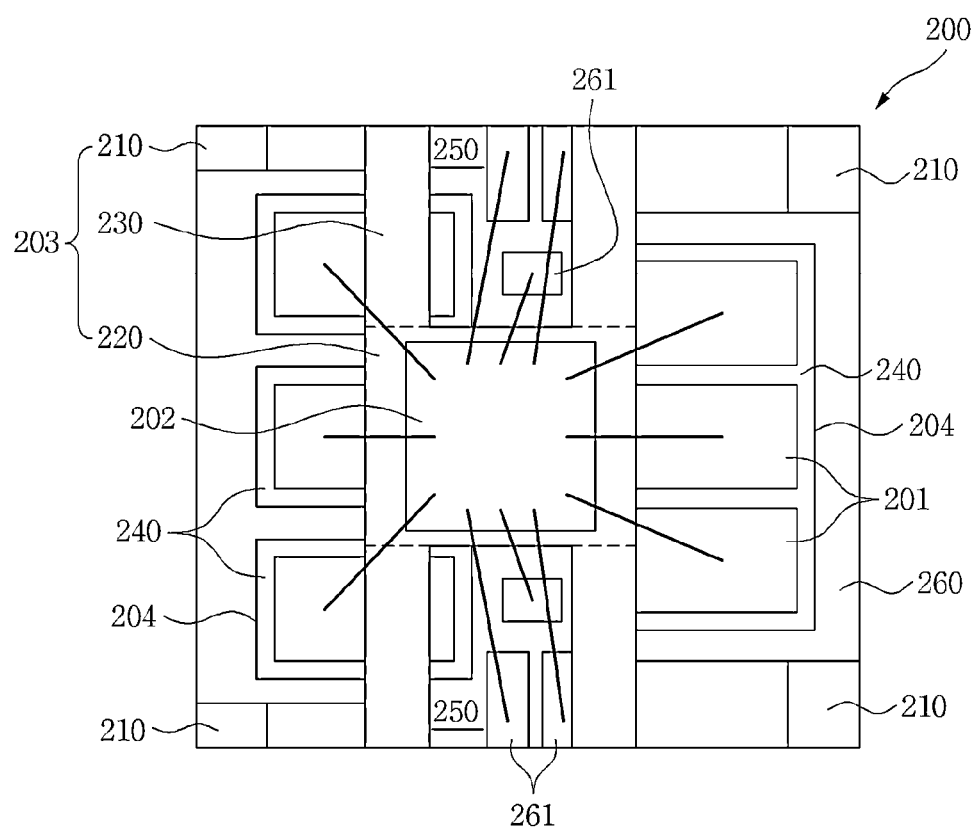
FIG. 5 is a plan view illustrating a disposition state of the power module package according to the second exemplary embodiment of the present disclosure.
Figure 6:
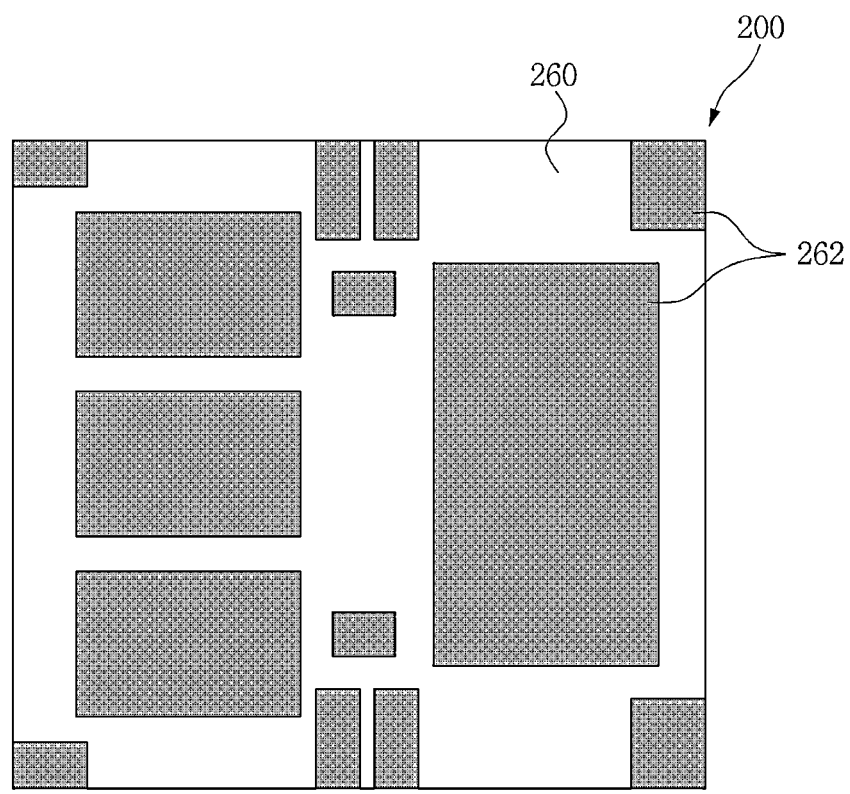
FIG. 6 is a bottom view illustrating the disposition state of the power module package according to the second exemplary embodiment of the present disclosure.

As illustrated in FIGS. 4 to 6, a leadless package type power semiconductor module 200 according to a second exemplary embodiment of the present disclosure includes power devices 201, control ICs 202 controlling the power devices 201, a bridge lead frame in which the power devices 201 or the control ICs 202 are mounted, and an inner lead frame.

The bridge lead frame 203 is configured by physically connecting connection terminals 210 of the surface mounting type (SMT) to a mounting area connected thereto through a bridge, in which a mounting area in which the power devices 201 including MOSFET, RC-IGBT, IGBT, FRD, and the like or the control ICs 202 including HVIC, LVIC, and the like are mounted is formed at a central portion and edges at which respective sides of four surfaces meet each other are provided with the connection terminals 210 which are connected to each other by the bridge 230, such that the bridge lead frame 203 generally has a 'H' shape when viewed from the top.

Here, the mounting area formed in the bridge lead frame 203 is referred to as a first mounting area 220 to prevent a confusion due to a use of the same term in the following description and another mounting area is referred to as a second mounting area 240.

A space part 250 is formed at a lower portion of the bridge 230 by bending the bridge 230 of the bridge lead frame 203, of which the central portion is provided with the first mounting area 220, upwardly in FIGS. 4 to 6 to generate a phase difference between the connection terminal 210 and the first mounting area 220 and between the first mounting area 220 and the second mounting area 240, thereby three-dimensionally mounting the power devices 201 and the control ICs 202.

That is, when the first mounting area 220 and the second mounting area 240 are defined to have different heights by bending the bridge 230 upwardly using an oblique line and a straight line, for example, the second mounting area 240 is defined as a first layer of the leadless package type power semiconductor module 200, the first mounting area 220 is disposed on a second layer to generate a phase difference.

The inner lead frame 204 is disposed at the lower portion of the connection part 230 in FIGS. 4 to 6, that is, disposed in the space part 250 formed between the connection terminals 210 to mount a bottom surface thereof by the surface mounting type (SMT) and a top surface thereof is provided with the second mounting area 240 in which the power devices 201 or the control ICs 202 are mounted. Here, the power devices 201 may be mounted in any one of the first and second mounting areas 220 and 240 and the control ICs 202 may also be mounted in any one of the first and second mounting areas 220 and 240, and thus the power devices 201 and the control ICs 202 are electrically connected to each other by the wire bonding using the space part 250, for example.

Further, the inner lead frames 204 are disposed at both sides, having the first mounting area 220 therebetween. In this case, when the power devices 201 are mounted in the second mounting areas 240 formed on the inner lead frames 204, the power devices 201 are connected to each other by the wire bonding to minimize the current path.

Meanwhile, the control ICs 202 are connected to passive devices 261 of a printed circuit board 260 to receive a supply of power and a control input. In the case of the printed circuit board 260, the connection terminal 210 and the bottom surface corresponding to the inner lead frame 204 for connecting to the outside may be provided with connection pads 262.

Figure 7:
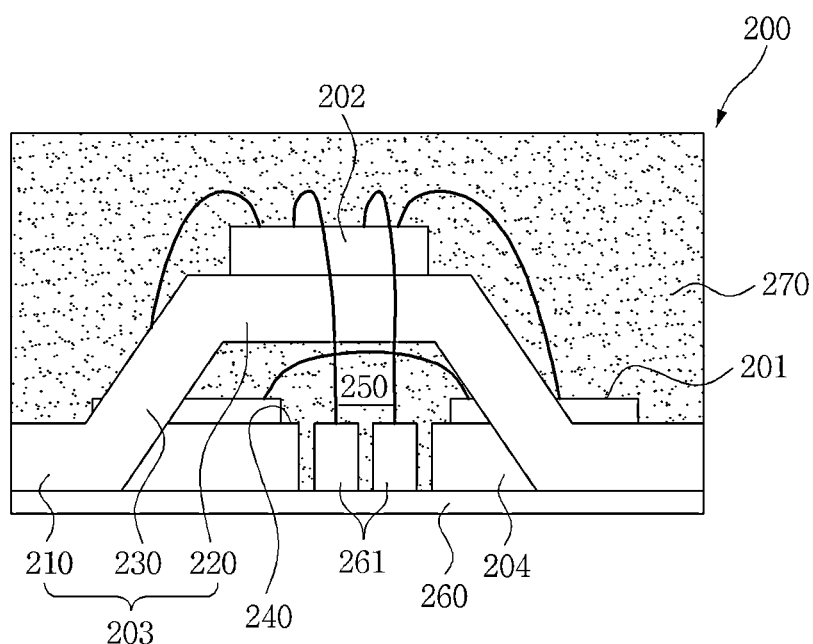
FIG. 7 is a side view illustrating the power module package according to the second exemplary embodiment of the present disclosure.

As illustrated in FIG. 7, an upper portion of the printed circuit board 260 is provided with a molding part (EMC mold) to seal various devices, the bridge lead frame 203, and the inner lead frame 204, such that the inner structure may not be confirmed at the upper portion of the leadless package type power semiconductor module 200 due to the molding part 270.

Therefore, according to the leadless package type power semiconductor module 200 according to the second exemplary embodiment of the present disclosure, all the four surfaces may be used due to the surface mounting type (SMT) structure of the quad flat package (QFP) and each device may be three-dimensionally mounted, thereby implementing high integration and miniaturization.

Further, at the time of mounting the power semiconductor module on the printed circuit board 260, the automatic mounting and the soldering may be performed, and thus the existing problem that the defective rate is increased due to a manual insertion process or a semi-manual insertion process of inserting the power semiconductor module into a hole formed in a circuit pattern of the printed circuit board (PCB) and the production management is degraded due to the additional use of a wave soldering process after other passive devices are inserted into the printed circuit board (PCB) unlike the soldering is solved, thereby simplifying the package process and increasing the efficiency.

Further, the loss or the malfunction due to the parasitic impedance is remarkably reduced by minimizing the current path between the power devices 201 or between the power devices 201 and the control ICs 202, thereby improving the performance.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A leadless package type power semiconductor module, comprising:
    connection terminals of a surface mounting type (SMT) formed at edges at which respective sides of four surfaces meet each other;
    a first mounting area connected to the connection terminals through a bridge to be disposed at a central portion thereof and mounted with power devices or control ICs electrically connected to the power devices to control the power devices; and
    second mounting areas formed between the connection terminals and mounted with the power devices or the control ICs,
    wherein the first mounting area is disposed at a different height from the second mounting area through the bridge to generate a phase difference from the second mounting area.

2. The leadless package type power semiconductor module of claim 1, wherein the control ICs are mounted in the first mounting area and the power devices are mounted in the second mounting area.

3. The leadless package type power semiconductor module of claim 1, wherein the power devices are mounted in the first mounting area and the control ICs are mounted in the second mounting area.

4. The leadless package type power semiconductor module of claim 1, wherein the power devices and the control ICs are connected to each other by wire bonding.

5. The leadless package type power semiconductor module of claim 1, wherein the second mounting areas are disposed at both sides, having the first mounting area therebetween, the power devices are mounted in the second mounting areas, and the respective power devices are connected to each other by wire bonding.

6. A leadless package type power semiconductor module, comprising:
    power devices and control ICs electrically connected to the power devices to control the power devices;
    a bridge lead frame having a central portion provided with a first mounting area in which the power devices or the control ICs are mounted, having respective edges provided with connection terminals of a surface mounting type (SMT), provided with a bridge connecting the connection terminals to the first mounting area, and provided with a space part to generate a phase difference between the connection terminal and the first mounting area;
    an inner lead frame of the surface mounting type (SMT) disposed in the space part and provided with a second mounting area in which the power devices or the control ICs are mounted; and
    a printed circuit board (PCB) on which passive devices are mounted,
    wherein the power devices and the control ICs are connected to each other by wire bonding, and
    wherein the printed circuit board is mounted with the connection terminals and one surface of the inner lead frame by the surface mounting type and the control ICs are connected to the passive devices by wire bonding.

7. The leadless package type power semiconductor module of claim 6, wherein the control ICs are mounted in the first mounting area and the power devices are mounted in the second mounting area.

8. The leadless package type power semiconductor module of claim 6, wherein the power devices are mounted in the first mounting area and the control ICs are mounted in the second mounting area.

9. The leadless package type power semiconductor module of claim 6, wherein the inner lead frames are disposed at both sides, having the first mounting area therebetween, the power devices are mounted in the second mounting areas, and the respective power devices are connected to each other by wire bonding.

10. The leadless package type power semiconductor module of claim 6, further comprising:
    an EMC mold sealing the bridge lead frame, the inner lead frame, the power devices, and the control ICs.

* * * * *